United States Patent
Huang et al.

(10) Patent No.: US 12,274,068 B2
(45) Date of Patent: Apr. 8, 2025

(54) METHOD OF FORMING FERROELECTRIC MEMORY DEVICE

(71) Applicant: Taiwan Semiconductor Manufacturing Company, Ltd., Hsinchu (TW)

(72) Inventors: Rainer Yen-Chieh Huang, Changhua County (TW); Han-Ting Tsai, Kaoshiung (TW); Tsann Lin, Taipei (TW); Kuo-Chang Chiang, Hsinchu (TW); Min-Kun Dai, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 253 days.

(21) Appl. No.: 17/740,331

(22) Filed: May 9, 2022

(65) Prior Publication Data
US 2023/0363173 A1    Nov. 9, 2023

(51) Int. Cl.
H10B 51/30 (2023.01)
H10B 51/10 (2023.01)
H10B 51/20 (2023.01)

(52) U.S. Cl.
CPC ............. H10B 51/30 (2023.02); H10B 51/10 (2023.02); H10B 51/20 (2023.02)

(58) Field of Classification Search
CPC ......... H10B 51/10; H10B 51/20; H10B 51/30
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 11,088,154 B1 * | 8/2021 | Yeong | H01L 29/66795 |
| 11,527,649 B1 * | 12/2022 | Huang | H01L 21/2236 |

(Continued)

FOREIGN PATENT DOCUMENTS

| | | | | |
|---|---|---|---|---|
| CN | 111668372 A | * | 9/2020 | ............. H01G 9/042 |
| CN | 112038212 A | * | 12/2020 | |

(Continued)

Primary Examiner — Matthew E Warren
(74) Attorney, Agent, or Firm — JCIPRNET

(57) ABSTRACT

Provided is a method of forming a ferroelectric memory device including: forming a ferroelectric layer between a gate electrode and a channel layer by a first atomic layer deposition (ALD) process. The first ALD process includes: providing a first precursor during a first section; and providing a first mixed precursor during a second section, wherein the first mixed precursor includes a hafnium-containing precursor and a zirconium-containing precursor. In this case, the ferroelectric layer is directly formed as $Hf_{0.5}Zr_{0.5}O_2$ with an orthorhombic phase (O-phase) to enhance the ferroelectric polarization and property.

9 Claims, 15 Drawing Sheets

(56) References Cited

U.S. PATENT DOCUMENTS

| | | | | |
|---|---|---|---|---|
| 2022/0173114 A1* | 6/2022 | Schenk | ............. | H01L 21/02189 |
| 2023/0064803 A1* | 3/2023 | Koo | ................. | H01L 29/66833 |
| 2024/0164111 A1* | 5/2024 | Liao | ....................... | H10B 51/30 |

FOREIGN PATENT DOCUMENTS

| | | | | | |
|---|---|---|---|---|---|
| CN | 114927525 A | * | 8/2022 | | |
| WO | WO-2021254989 A1 | * | 12/2021 | ........... | C23C 16/405 |
| WO | WO-2022083898 A1 | * | 4/2022 | ............. | H01L 28/40 |
| WO | WO-2022084782 A1 | * | 4/2022 | ............. | G11C 11/22 |

\* cited by examiner

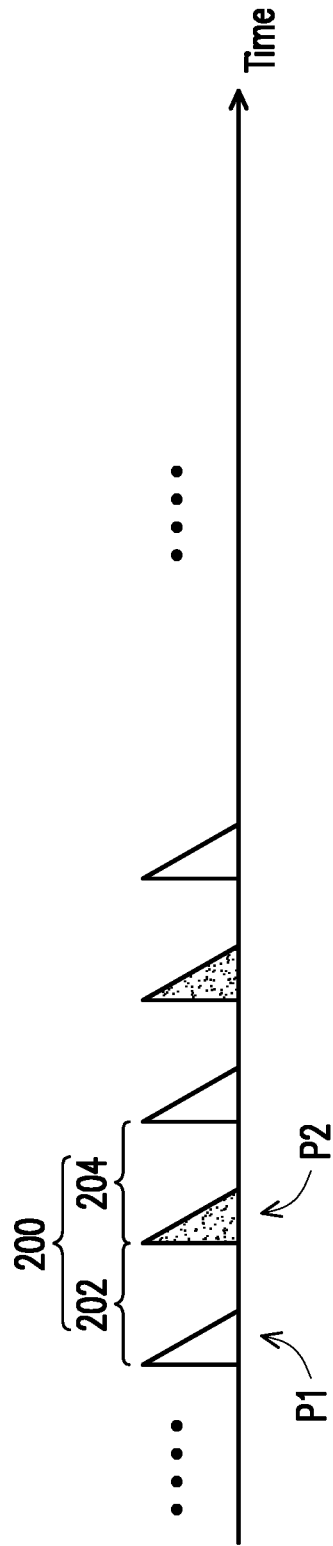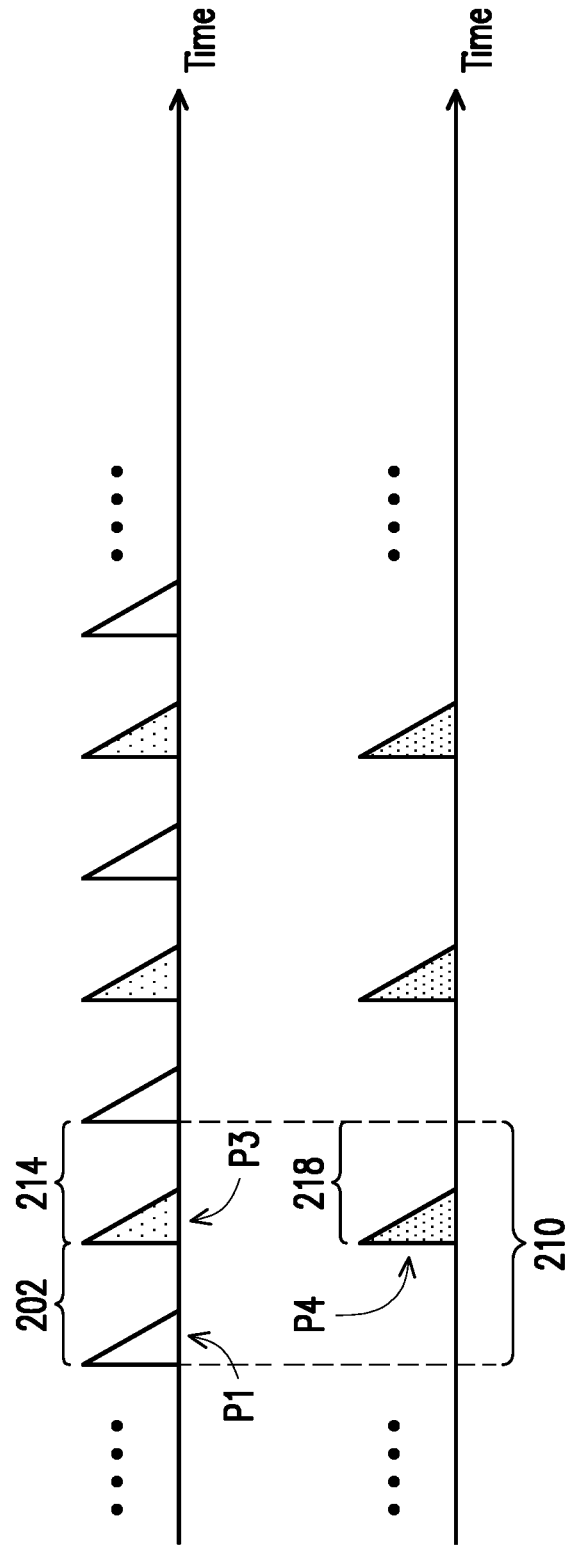

METHOD OF FORMING FERROELECTRIC MEMORY DEVICE

BACKGROUND

Non-volatile memory device, in contrast to volatile memory device, can retain stored data even after removal of power supply. Ferroelectric memory device is a type of the non-volatile memory device, and includes a ferroelectric material for storing permanent dipole moment. Further, polarity of such dipole moment stored in the ferroelectric material can be switched by adjusting an applied electrical field. Accordingly, binary data "1", "0" can be stored as polarizations with different polarities.

Ferroelectric field effect transistor (FET) is a type of the ferroelectric memory device that resembles a typical FET, except that a ferroelectric material is sandwiched between a gate terminal and a channel region. The polarizations with different polarities stored in the ferroelectric material may affect a threshold voltage of the ferroelectric FET, and can be non-destructively read out by sensing a channel resistance of the ferroelectric FET. It should be noted that the ferroelectric material has a higher ferroelectric polarization and/or better ferroelectric property in an orthorhombic phase (O-phase). Therefore, how to directly form a ferroelectric material having the O-phase will become an important topic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic pulse diagram illustrating a method for forming a ferroelectric layer in the ferroelectric memory device shown in FIG. 1A, according to some embodiments of the present disclosure.

FIG. 2B is a schematic pulse diagram illustrating a method for forming a ferroelectric layer in the ferroelectric memory device shown in FIG. 1A, according to some alternative embodiments of the present disclosure.

DETAILED DESCRIPTION

Figure 1A:
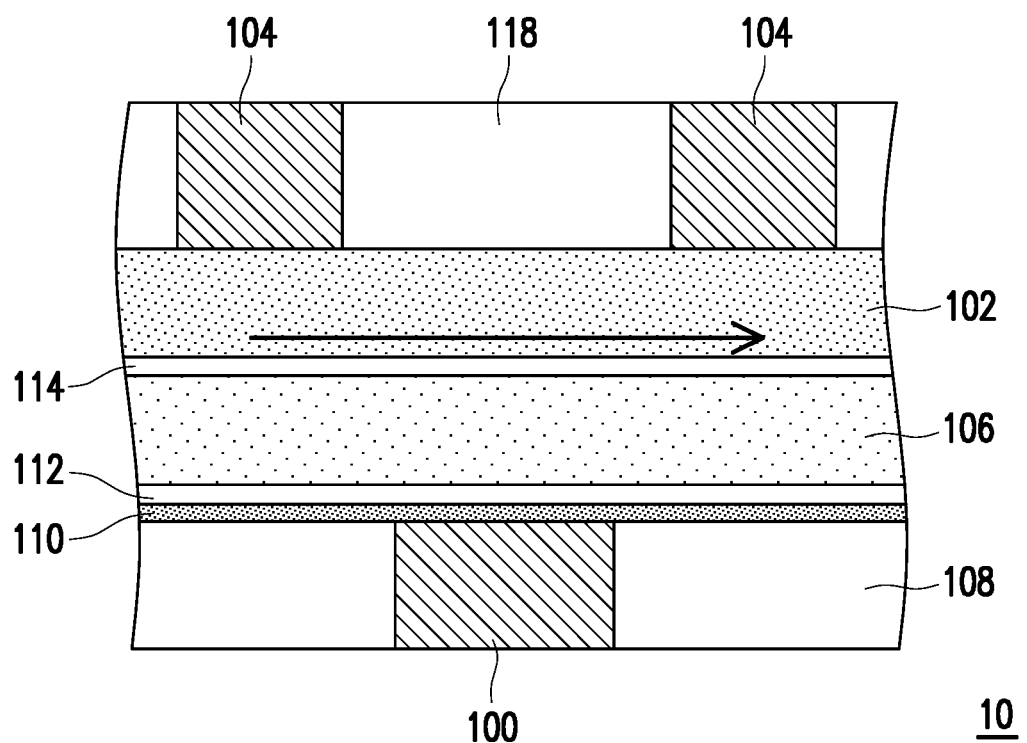
FIG. 1A is a cross-sectional view schematically illustrating a ferroelectric memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a cross-sectional view schematically illustrating a ferroelectric memory device 10 according to some embodiments of the present disclosure.

Referring to FIG. 1A, the ferroelectric memory device 10 is a ferroelectric FET with a bottom gate configuration. A gate electrode 100 lies below a channel layer 102, and a pair of source/drain electrodes 104 may be separately in contact with the channel layer 102 from above the channel layer 102. Further, a ferroelectric layer 106 is sandwiched between the gate electrode 100 and the overlying channel layer 102. The ferroelectric layer 106 can store binary data as polarizations with different polarities by adjusting an electric field across the ferroelectric layer 106, and alter a threshold voltage as well as a channel resistance of the ferroelectric memory device 10. By sensing the channel resistance, the binary data stored in the ferroelectric memory device 10 can be read out.

In some embodiments, the ferroelectric memory device 10 is embedded in a back-end-of-line (BEOL) structure of a device die. Although not shown, a front-end-of-line (FEOL) structure including active devices (e.g., metal-oxide-semiconductor (MOS) FETs) formed on a semiconductor substrate (e.g., a semiconductor wafer) lies below the BEOL structure, and some conductive features in the BEOL structure interconnect the underlying active devices, to form an integrated circuit. In these embodiments, as a planar type ferroelectric FET, the gate electrode 100 may be formed in one of a stack of dielectric layers (labeled as a dielectric layer 108) in the BEOL structure. The conductive features for interconnecting the underlying active devices may be formed elsewhere in the stack of the dielectric layers. The gate electrode 100 is formed of a conductive material. For instance, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof. In some embodiments, a thickness of the gate electrode 100 ranges from about 5 nm to about 500 nm.

The ferroelectric layer 106 lies over the dielectric layer 108 and the gate electrode 100. In some embodiments, the ferroelectric layer 106 globally covers the dielectric layer 108, and is overlapped with the gate electrode 100. The ferroelectric layer 106 is formed of a ferroelectric material. As an example, the ferroelectric material may include hafnium zirconium oxide (HfZrO or HZO). In some embodiments, the HfZrO may be presented as $Hf_xZr_yO_z$, where x:y:z may be 1:1:4. In some embodiments, X:Y may be between 6:4 and 4:6. In the present embodiment, the HfZrO may be presented as $Hf_{0.5}Zr_{0.5}O_2$. Further, the HfZrO may be doped with elements with smaller ion radius or elements with larger ion radius, in order to enhance ferroelectric polarization. The elements with smaller ion radius may include Al or Si, while the elements with larger ion radius may include La, Sc, Ca, Ba, Gd, Y, Sr or the like. Moreover, oxygen vacancies may be formed in the HfZrO. As another example, the ferroelectric material may include aluminum nitride (AlN) doped Sc (AlN:Sc). In some embodiments, a thickness of the ferroelectric layer 106 ranges from 0.1 nm to 300 nm.

In some embodiments, a buffer layer 110 and a seed layer 112 are sandwiched between the ferroelectric layer 106 and the underlying dielectric layer 108 and the gate electrode 100. The buffer layer 110 may lie on the dielectric layer 108 and the gate electrode 100. A material of the buffer layer 110 may be selected to reduce a lattice mismatch at an interface defined between the ferroelectric layer 106 and the gate electrode 100. For instance, the buffer layer 110 may be formed of hafnium oxide, zirconium oxide, titanium oxide, tungsten oxide or combinations thereof. In addition, a thickness of the buffer layer 110 may range from 1 Å to 20 Å, and the buffer layer 110 may be amorphous or crystallized. On the other hand, the seed layer 112 may be formed on the buffer layer 110, and in contact with the ferroelectric layer 106 from below the ferroelectric layer 106. The seed layer 112 is formed by a selected material with a preferred crystalline phase, to promote an orthorhombic phase (O-phase) of the ferroelectric layer 106, and to inhibit a monoclinic phase (M-phase) of the ferroelectric layer 106. The increased O-phase of the ferroelectric layer 106 may result in a higher ferroelectric polarization. In those embodiments where the ferroelectric layer 106 is formed of HfZrO, the seed layer 112 may be formed of zirconium oxide (e.g., $ZrO_2$), and may be crystallized to the O-phase or a tetragonal phase (T-phase), to increase an O-phase fraction of the ferroelectric layer 106. The O-phase, the T-phase, a cubic phase (C-phase) and the M-phase may coexist in the ferroelectric layer 106 formed of HfZrO. By using the seed layer 112 with a preferred crystalline phase (e.g., the O-phase or the T-phase) as a growth template of the ferroelectric layer 106, a total phase fraction of the O-phase, the T-phase and the C-phase (represented by "(O+T+C)") in the ferroelectric layer 106 may be increased. For instance, the (O+T+C) in the ferroelectric layer 106 may be greater than 50% of the M-phase fraction in the ferroelectric layer 106. As another indicator, a ratio of the (O+T+C) over a total phase fraction of the O-phase, the T-phase, the C-phase and the M-phase (represented by "(O+T+C+M)") may be increased by using the seed layer 112 with the preferred crystalline phase as the growth template of the ferroelectric layer 106. Other available materials for the seed layer 112 as the growth template of the HfZrO ferroelectric layer 106 may include yttrium oxide (e.g., $Y_2O_3$), zirconium yttrium oxide (ZYO), aluminum oxide (e.g., $Al_2O_3$), tantalum oxide (e.g., $Ta_2O_5$), hafnium zirconium oxide (e.g., $Hf_xZr_yO_z$, where X:Y:Z may be 1:1:4) and hafnium oxide (e.g., $HfO_x$, where the "x" from 1 to 2). In alternative embodiments where the ferroelectric layer 106 is formed of AlN:Se, the seed layer 112 may be formed of aluminum nitride (AlN). Further, each of these material alternatives for the seed layer 112 may be crystallized to the C-phase, the T-phase, the O-phase or combinations thereof. In addition, the seed layer 112 may be a single layer, or a multilayer structure including one or more of the available material alternatives described above. In some embodiments, a thickness of the seed layer 112 ranged from 0.1 nm to 30 nm.

The channel layer 102 lies over the ferroelectric layer 106, and may be formed of a semiconductor material. The semiconductor material may be an oxide semiconductor material, a group IV semiconductor material or a group III-V semiconductor material. For instance, the oxide semiconductor material may include indium-gallium-zinc-oxide (IGZO), tin oxide ($SnO_x$), indium oxide ($InO_x$), gallium oxide (e.g., $Ga_2O_3$), zinc oxide (e.g., ZnO), magnesium oxide (e.g., MgO), gadolinium oxide (e.g., GdO) or in any binary-, ternary-, quaternary-combinations. Indium-zinc-oxide (InZnO) may be one of the binary combination examples. Tin-gallium-zinc-oxide (SnGaZnO) and tin-indium-zinc-oxide (SnInZnO) may be two of the ternary combination examples, and tin-indium-gallium-zinc-oxide (SnInGaZnO) may be one of the quaternary combination examples. On the other hand, the group IV semiconductor material may include Si and/or SiGe, and the group III-V semiconductor material may include GaN, GaAs or InGaAs. In some embodiments, the channel layer 102 is formed of amorphous IGZO, with a thickness ranging from 0.1 nm to 100 nm.

In some embodiments, a blocking layer 114 lies between the ferroelectric layer 106 and the overlying channel layer 102. The blocking layer 114 may be in contact with the overlying ferroelectric layer 106 and the underlying channel layer 102. The blocking layer 114 may include a material selected to enhance conduction band offset ($V_{CBO}$) and valence band offset ($V_{VBO}$) with respect to conduction and valence bands of the channel layer 102, in order to increase a potential barrier between the ferroelectric layer 106 and the channel layer 102. Accordingly, leakage current entering the ferroelectric layer 106 from the channel layer 102 can be reduced by disposing the blocking layer 114. In some embodiments, the blocking layer 114 may include an oxide ferroelectric material. For instance, the oxide ferroelectric material may include hafnium oxide ($HfO_x$) or zirconium oxide ($ZrO_x$), and may be doped with materials with higher bandgap (i.e., higher than bandgap of the semiconductor material for forming the channel layer 102). These materials incorporated in the oxide ferroelectric material may include silicon oxide (e.g., $SiO_2$), yttrium oxide (e.g., $Y_2O_3$), magnesium oxide (e.g., MgO), aluminum oxide (e.g., $Al_2O_3$), silicon nitride (e.g., $Si_3N_4$), lanthanum oxide (e.g., $La_2O_3$), strontium oxide (e.g., SrO), gadolinium oxide (e.g., GdO), calcium oxide (e.g., CaO), scandium oxide (e.g., $Sc_2O_3$), zirconium-silicon-oxide (e.g., $ZrSiO_4$), hafnium-silicon-oxide (e.g., $HfSiO_4$), combinations thereof or other candidates having bandgap greater than the bandgap of the channel layer 102. For instance, in those embodiments where the channel layer 102 is formed of amorphous IGZO, the blocking layer 114 may include $Hf_xSi_{1-x}O_y$, (where the "x" is 0.25, and the "y" is from 2 to 4), and the $V_{CBO}$ may be about 3.57 eV, and the $V_{VBO}$ may be about 0.67 eV. In alternative embodiments, the blocking layer 114 may be respectively formed of a non-ferroelectric material, such as a dielectric material.

Although the blocking layer 114 illustrated in FIG. 1A is a single-layered structure, the embodiments of the present disclosure are not limited thereto. In other embodiments, the blocking layer 114 may include a bi-layered structure or a multi-layered structure with the same material or different materials. In some embodiments, a thickness of the blocking layer 114 ranges from 0.1 nm to 50 nm.

The source/drain electrodes 104 may be disposed on a side of the channel layer 102 facing away from the blocking layer 114. As shown in FIG. 1A, the channel layer 102 may lie on the blocking layer 114, and the source/drain electrodes 104 are disposed on the channel layer 102. In some embodiments, the source/drain electrodes 104 are laterally surrounded by a dielectric layer 118. The source/drain electrodes 104 are formed of a conductive material. For instance, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof. In some embodiments, a thickness of the source/drain electrodes 104 ranges from about 15 nm to about 500 nm.

Figure 1B:
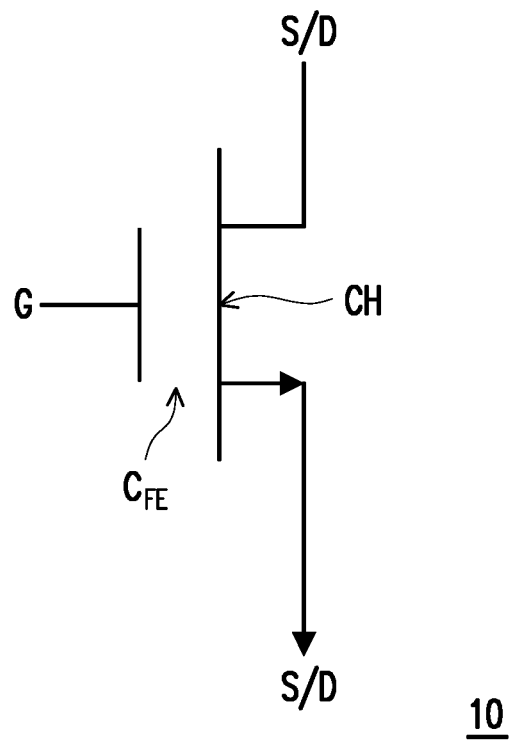
FIG. 1B is a circuit diagram of the ferroelectric memory device as shown in FIG. 1A.

FIG. 1B is a circuit diagram of the ferroelectric memory device 10 as shown in FIG. 1A.

Referring to FIG. 1A and FIG. 1B, the ferroelectric memory device 10 may be a ferroelectric FET. The gate electrode 100 may be functioned as a gate terminal G of the ferroelectric FET, and the source/drain electrodes 104 may be functioned as source/drain terminals S/D of the ferroelectric FET. A conduction channel CH extending between the source/drain terminals S/D may be established when the ferroelectric FET is turned on, and may be cut off or absent when the ferroelectric FET is in an off state. As described with reference to FIG. 1A, the conduction channel CH may be established in the channel layer 102. The gate terminal G is capacitively coupled to the conduction channel CH through a gate capacitor $C_{FE}$, and configured to control formation of the conduction channel CH. The gate capacitor $C_{FE}$ is formed across layers including the ferroelectric layer 106, thus may be referred as a ferroelectric capacitor $C_{FE}$.

Although not shown, the ferroelectric memory device 10 may be a single memory cell in a memory array. In some embodiments, the memory array is a two-dimensional memory that includes columns and rows of the ferroelectric memory devices 10 deployed at a single horizontal level. In alternative embodiments, the memory array is a three-dimensional memory that includes stacks of the ferroelectric memory devices 10. In these alternative embodiments, the ferroelectric memory devices 10 in each stack are arranged along a vertical direction.

FIG. 2A is a schematic pulse diagram illustrating a method for forming the ferroelectric layer 106, according to some embodiments of the present disclosure.

Referring to FIG. 1A and FIG. 2A, in some embodiments, a method for forming the ferroelectric layer 106 includes a single deposition process. In these embodiments, the deposition process may be an atomic layer deposition (ALD) process. During the ALD process, multiple deposition cycles 200 are performed. Each deposition cycle 200 may include a first section 202 and a second section 204. A precursor pulse P1 is provided during the first section 202, and a precursor pulse P2 is provided during the second section 204. A precursor used for the precursor pulse P1 may be different from the precursor used for the precursor pulse P2. In those embodiments where the ferroelectric layer 106 is formed of hafnium zirconium oxide ($Hf_{0.5}Zr_{0.5}O_2$), the precursor used for the precursor pulse P1 may be oxygen-containing precursor, while the precursor used for the precursor pulse P2 may be mixed precursor with hafnium (Hf and zirconium (Zr), where the content ratio of Hf to Zr is about 1:1. In some embodiments, the content ratio of hafnium-containing precursor to zirconium-containing precursor between 4:6 and 6:4. For instance, the oxygen-containing precursor may include diatomic oxygen ($O_2$), ozone ($O_3$), dihydrogen monoxide ($H_2O$), plasma $O_3$, plasma $O_2$, or a combination thereof. In addition, as examples, the hafnium-containing precursor may include tetrakis(ethylmethylamino)hafnium ($[(CH_3)(C_2H_5)N]_4Hf$), hafnium tetrachloride ($HfCl_4$), Bis(trimethylsilyl)amidohafnium(IV) chloride≥95%, ≥99.99% trace metals basis ($[[(CH_3)_3Si]_2N]_2HfCl_2$), Dimethylbis(cyclopentadienyl) hafnium(IV) (($C_5H_5)_2Hf(CH_3)_2$), Hafnium(IV) tert-butoxide packaged for use in deposition systems ($Hf[OC(CH_3)_3]_4$), Hafnium isopropoxide isopropanol adduct 99.9% trace metals basis ($C_{12}H_{28}HfO_4$), Tetrakis (diethylamido)hafnium(IV) 99.99% ($[(CH_2CH_3)_2N]_4Hf$), Tetrakis(dimethylamido)hafnium(IV)≥99.99% ($[(CH_3)_2N]_4Hf$), Tetrakis(dimethylamido)hafnium(IV) packaged for use in deposition systems ($[(CH_3)_2N]_4Hf$), tetrakis(ethylmethylamido)hafnium(IV)≥99.99% trace metals basis ($[(CH_3)(C_2H_5)N]_4Hf$), Tetrakis(ethylmethylamido) hafnium(IV) packaged for use in deposition systems ($[(CH_3)(C_2H_5)N]_4Hf$), or a combination thereof. Further, as examples, the zirconium-containing precursor may include Bis(cyclopentadienyl)zirconium(IV) dihydride 95% ($C_{10}H_{12}Zr$), Bis(methyl-q5-cyclopentadienyl)methoxymethylzirconium packaged for use in deposition systems ($Zr(CH_3C_5H_4)_2CH_3OCH_3$), Dimethylbis(pentamethylcyclopentadienyl)zirconium(IV) ($C_{22}H_{36}Zr$), Tetrakis(dimethylamido)zirconium(IV) electronic grade, ≥99.99% trace metals basis ($[(CH_3)_2N]_4Zr$), Tetrakis(dimethylamido)zirconium(IV) packaged for use in deposition systems ($[(CH_3)_2N]_4Zr$), Tetrakis(ethylmethylamido)zirconium(IV)≥99.99% trace metals basis ($Zr(NCH_3C_2H_5)_4$), Tetrakis(ethylmethylamido)zirconium(IV) packaged for use in deposition systems ($Zr(NCH_3C_2H_5)_4$), Zirconium(IV) dibutoxide(bis-2,4-pentanedionate) solution 25 wt. % (in 1-butanol/toluene), 99.9% trace metals basis ($C_{18}H_{32}O_6Zr$), Zirconium(IV) 2-ethylhexanoate in mineral spirits ~6% Zr basis ($Zr(C_8H_{15}O_2)_4$), Zirconium tetrakis(2,2,6,6-tetramethyl-3,5-heptanedionate)≥99.99% ($Zr(OCC(CH_3)_3CHCOC(CH_3)_4$), Zirconium Chlore ($ZrCl_4$), or a combination thereof. In some embodiments, each of the precursor pulses P1, P2 is followed by a purge step, such that the precursor pulses P1, P2 may be separated from one another by a non-zero time interval. In addition, the deposition cycle 200 may be repeated until an expected thickness of the ferroelectric layer 106 is achieved.

Figure 6:
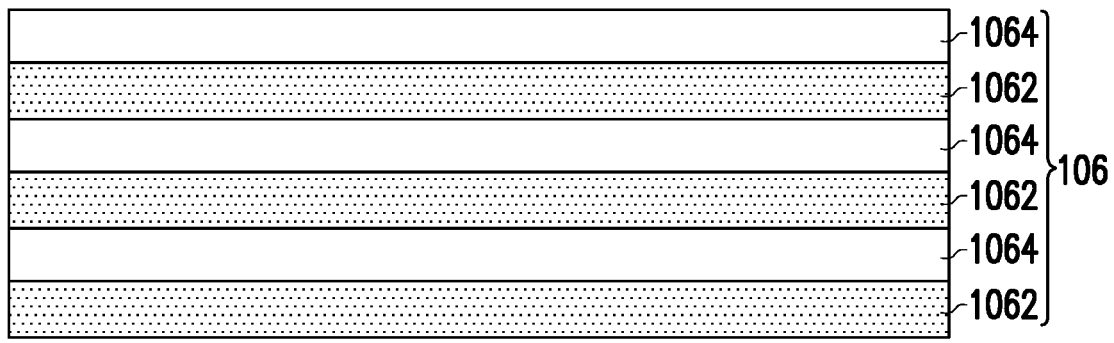
FIG. 6 is a schematic cross-sectional view illustrating a ferroelectric layer, according to some embodiments of the present disclosure.

It should be noted that the said ALD process using the mixed and/or cocktail precursor having the hafnium-containing precursor and the zirconium-containing precursor can directly form the ferroelectric layer 106 with the O-phase. In detail, as shown in FIG. 6, the ferroelectric layer 106 formed by the said ALD process may include a stack structure having a plurality of first layers 1062 and a plurality of second layers 1064 stacked alternately. Specifically, during each deposition cycle 200, the precursor pulse P1 (e.g., $H_2O$) is provided to the ALD process chamber to react, and then the first layer 1062 (e.g., oxygen layer) is formed. Next, the precursor pulse P2 (e.g., mixing $HfCl_4$/$ZrCl_4$) is provided to the ALD process chamber to react, and then the second layer 1064 (e.g., mixing Hf/Zr layer) is formed. In this case, the hafnium (Hf) atoms and the zirconium (Zr) atoms can be deposited in the same plane, so as to form the orthorhombic crystal structure with the underlying and overlying oxygen layers 1062, thereby achieving the better ferroelectric property. That is, by the said ALD process to directly form the ferroelectric layer 106 with the O-phase crystal structure, the domain crystal orientation can be more uniform and reduce wake-up effect. On the other hands, when a stacking process not follow the said stacking process (e.g., oxygen layer 1062/mixing Hf/Zr layer 1064/oxygen layer 1062 . . . ) illustrated in FIG. 6, the O-phase domain formation must need some formation energy (e.g., annealing step) to re-crystallization O-phase from non-O-phase domains. Furthermore, even if the annealing step is performed to re-crystallize to O-phase domains, it will result not good crystal orientation for each O-phase domain. Therefore, the said ALD process using the mixed and/or cocktail precursor can directly form the ferroelectric layer 106 with the O-phase without any annealing step, thereby simplifying process steps and reducing the fabrication cost.

FIG. 2B is a schematic pulse diagram illustrating a method for forming the ferroelectric layer 106, according to some alternative embodiments of the present disclosure. An ALD process to be described with reference to FIG. 2B is similar to the ALD process described with reference to FIG. 2A, thus only difference between these ALD processes will be discussed. The like or the same parts in these ALD processes may not be repeated again.

Referring to FIG. 2B, in the ALD process, multiple deposition cycles 210 are consecutively performed. The deposition cycle 210 is similar to the deposition cycle 200 as described with reference to FIG. 2A, except that a third section 214 is overlapped with a fourth section 218 in the same deposition cycle 210, which is followed by the first section 202 in the next deposition cycle 210. Specifically, during each deposition cycle 210, after the precursor pulse P1 is provided to an ALD process chamber, the precursor pulses P3 and P4 are simultaneously provided to the ALD process chamber. That is, time periods at which the precursor pulses P3, P4 are provided to the ALD process chamber overlap, and the precursor pulse P1 is provided before the precursor pulses P3, P4. In some embodiments, the precursor pulses P3, P4 in the same deposition cycle 210 are entirely overlapped with each other. In those embodiments where the ferroelectric layer 106 is formed of hafnium zirconium oxide ($Hf_{0.5}Zr_{0.5}O_2$), the precursor used for the precursor pulse P1 may be oxygen-containing precursor, while the precursor used for the precursor pulse P3 may be hafnium-containing precursor and the precursor used for the precursor pulse P4 may be zirconium-containing precursor. In some embodiments, the content ratio of hafnium-containing precursor to zirconium-containing precursor between 4:6 and 6:4. In some alternative embodiments, the precursor used for the precursor pulse P3 may be zirconium-containing precursor and the precursor used for the precursor pulse P4 may be hafnium-containing precursor. For instance, the oxygen-containing precursor may include diatomic oxygen ($O_2$), ozone ($O_3$), dihydrogen monoxide ($H_2O$), plasma $O_3$, plasma $O_2$, or a combination thereof. In addition, as examples, the hafnium-containing precursor may include tetrakis (ethylmethylamino)hafnium ($[(CH_3)(C_2H_5)N]_4Hf$), hafnium tetrachloride ($HfCl_4$), Bis(trimethylsilyl)amidohafnium(IV) chloride≥95%, ≥99.99% trace metals basis ($[[(CH_3)_3Si]_2N]_2HfCl_2$), Dimethylbis(cyclopentadienyl) hafnium(IV) (($C_5H_5)_2Hf(CH_3)_2$), Hafnium(IV) tert-butoxide packaged for use in deposition systems ($Hf[OC(CH_3)_3]_4$), Hafnium isopropoxide isopropanol adduct 99.9% trace metals basis ($C_{12}H_{28}HfO_4$), Tetrakis (diethylamido)hafnium(IV) 99.99% ($[(CH_2CH_3)_2N]_4Hf$), Tetrakis(dimethylamido)hafnium(IV)≥99.99% ($[(CH_3)_2N]_4Hf$), Tetrakis(dimethylamido)hafnium(IV) packaged for use in deposition systems ($[(CH_3)_2N]_4Hf$), tetrakis(ethylmethylamido)hafnium(IV)≥99.99% trace metals basis ($[(CH_3)(C_2H_5)N]_4Hf$), Tetrakis(ethylmethylamido) hafnium(IV) packaged for use in deposition systems ($[(CH_3)(C_2H_5)N]_4Hf$), or a combination thereof. Further, as examples, the zirconium-containing precursor may include Bis(cyclopentadienyl)zirconium(IV) dihydride 95% ($C_{10}H_{12}Zr$), Bis(methyl-q5-cyclopentadienyl)methoxymethylzirconium packaged for use in deposition systems ($Zr(CH_3C_5H_4)_2CH_3OCH_3$), Dimethylbis(pentamethylcyclopentadienyl)zirconium(IV) ($C_{22}H_{36}Zr$), Tetrakis(dimethylamido)zirconium(IV) electronic grade, ≥99.99% trace metals basis ($[(CH_3)_2N]_4Zr$), Tetrakis(dimethylamido)zirconium(IV) packaged for use in deposition systems ($[(CH_3)_2N]_4Zr$), Tetrakis(ethylmethylamido)zirconium(IV) ≥99.99% trace metals basis ($Zr(NCH_3C_2H_5)_4$), Tetrakis(ethylmethylamido)zirconium(IV) packaged for use in deposition systems ($Zr(NCH_3C_2H_5)_4$), Zirconium(IV) dibutoxide (bis-2,4-pentanedionate) solution 25 wt. % (in 1-butanol/toluene), 99.9% trace metals basis ($C_{18}H_{32}O_6Zr$), Zirconium (IV) 2-ethylhexanoate in mineral spirits ~6% Zr basis (Zr ($C_8H_{15}O_2)_4$), Zirconium tetrakis(2,2,6,6-tetramethyl-3,5-heptanedionate)≥99.99% ($Zr(OCC(CH_3)_3CHCOC(CH_3)_4$), Zirconium Chlore ($ZrCl_4$), or a combination thereof. In some embodiments, each of the precursor pulses P1, P3, P4 is followed by a purge step, such that the precursor pulses P1, P3, P4 may be separated from one another by a non-zero time interval. In addition, the deposition cycle 210 may be repeated until an expected thickness of the ferroelectric layer 106 is achieved.

It should be noted that the said ALD process by simultaneously providing the hafnium-containing precursor and the zirconium-containing precursor during the overlapping section can directly form the ferroelectric layer 106 with the O-phase. Specifically, the hafnium-containing precursor and the zirconium-containing precursor can be mixed uniformly during the overlapping section 214/218 to form the second layer 1064 (e.g., mixing Hf/Zr layer) illustrated in FIG. 6. In this embodiment, the hafnium-containing precursor and the zirconium-containing precursor may be referred to as co-pulsing precursors. In addition, the structure of the ferroelectric layer 106 formed by the said ALD process by using the co-pulsing precursors is also illustrated in FIG. 6, which has been described in detail in the above paragraphs, and will not be repeated here.

Figure 2C:
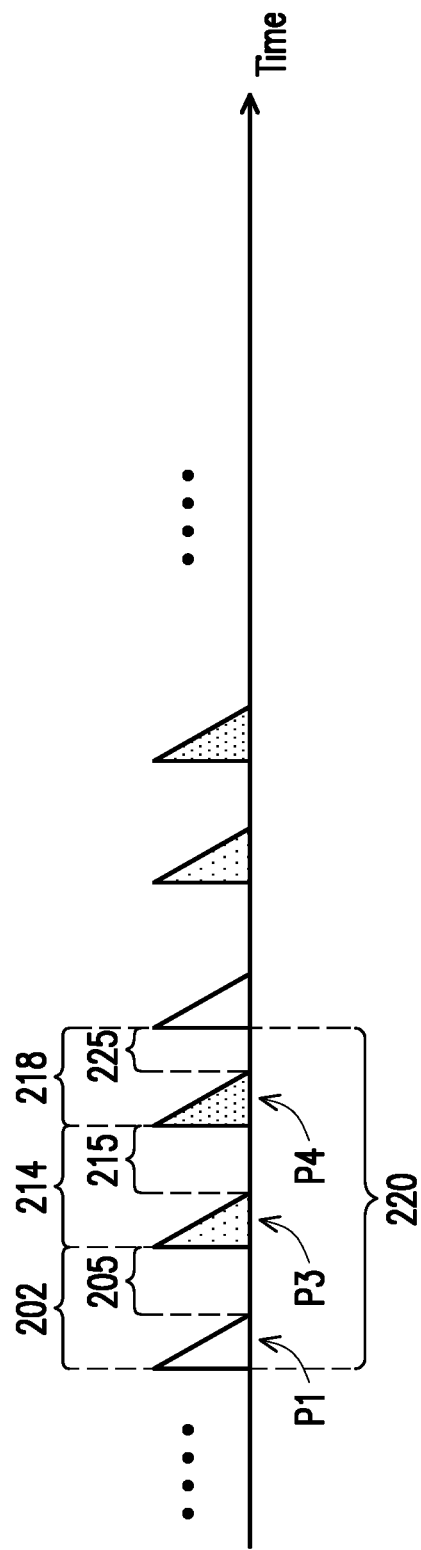
FIG. 2C is a schematic pulse diagram illustrating a method for forming a ferroelectric layer in the ferroelectric memory device shown in FIG. 1A, according to some other embodiments of the present disclosure.

FIG. 2C is a schematic pulse diagram illustrating a method for forming the ferroelectric layer 106, according to some other embodiments of the present disclosure. An ALD process to be described with reference to FIG. 2C is similar to the ALD process described with reference to FIG. 2A, thus only difference between these ALD processes will be discussed. The like or the same parts in these ALD processes may not be repeated again.

Referring to FIG. 2C, in the ALD process, multiple deposition cycles 220 are consecutively performed. The deposition cycle 220 is similar to the deposition cycle 200 as described with reference to FIG. 2A, except that a fourth section 218 has a short purge 225, which is followed by the first section 202 in the next deposition cycle 220. Specifically, during each deposition cycle 220, the precursor pulse P1 is provided to an ALD process chamber to react, and then a normal purge 205 is performed to remove the unreacted precursor used for the precursor pulse P1 during the first section 202. Next, the precursor pulse P3 is provided to the ALD process chamber to react, and then a normal purge 215 is performed to remove the unreacted precursor used for the precursor pulse P3 during the third section 214. Thereafter, the precursor pulse P4 is provided to the ALD process chamber to react, and then the short purge 225 is performed to remove the unreacted precursor used for the precursor pulse P4 during the fourth section 218. It should be noted that the precursors used for the precursor pulses P3 and P4 can be mixed uniformly and seldom be purged during the short purge 225. In this case, when the ferroelectric layer 106 is formed of hafnium zirconium oxide ($Hf_{0.5}Zr_{0.5}O_2$), the hafnium atoms and the zirconium atoms can be deposited in the same plane, so as to form the orthorhombic crystal structure with the underlying and overlying oxygen layers 1062 (FIG. 6), thereby achieving the better ferroelectric property. In some embodiments, the time of the short purge 225 is less than 1 second. In some alternative embodiments, the time of the short purge 225 is less than 0.1 second. In some embodiments, a ratio of the time of the normal purge 205 or 215 to the time of the short purge 225 is about 5:1. In addition, the structure of the ferroelectric layer 106 formed by the said ALD process by using the short purge is also illustrated in FIG. 6, which has been described in detail in the above paragraphs, and will not be repeated here.

Figure 2D:
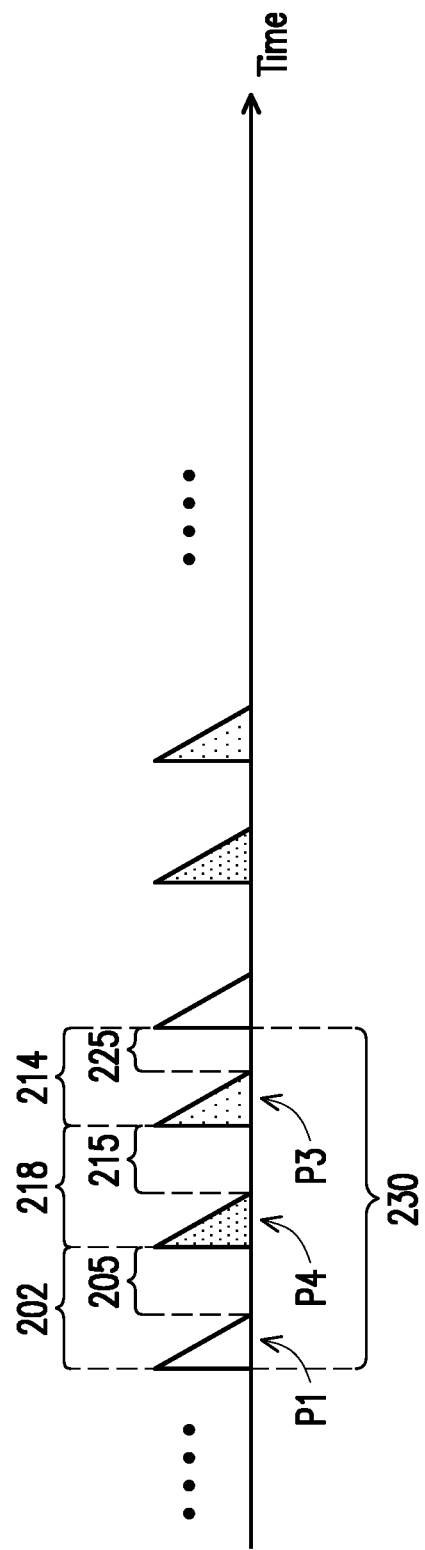
FIG. 2D is a schematic pulse diagram illustrating a method for forming a ferroelectric layer in the ferroelectric memory device shown in FIG. 1A, according to some other embodiments of the present disclosure.

FIG. 2D is a schematic pulse diagram illustrating a method for forming the ferroelectric layer 106, according to some other embodiments of the present disclosure. An ALD process to be described with reference to FIG. 2D is similar to the ALD process described with reference to FIG. 2C, except swapping the order of the third section 214 and the fourth section 218. In detail, during each deposition cycle 230, the precursor pulse P1 is provided to an ALD process chamber to react, and then a normal purge 205 is performed to remove the unreacted precursor used for the precursor pulse P1 during the first section 202. Next, the precursor pulse P4 is provided to the ALD process chamber to react, and then a normal purge 215 is performed to remove the unreacted precursor used for the precursor pulse P4 during the fourth section 218. Thereafter, the precursor pulse P3 is provided to the ALD process chamber to react, and then the short purge 225 is performed to remove the unreacted precursor used for the precursor pulse P3 during the third section 214.

Figure 3A:
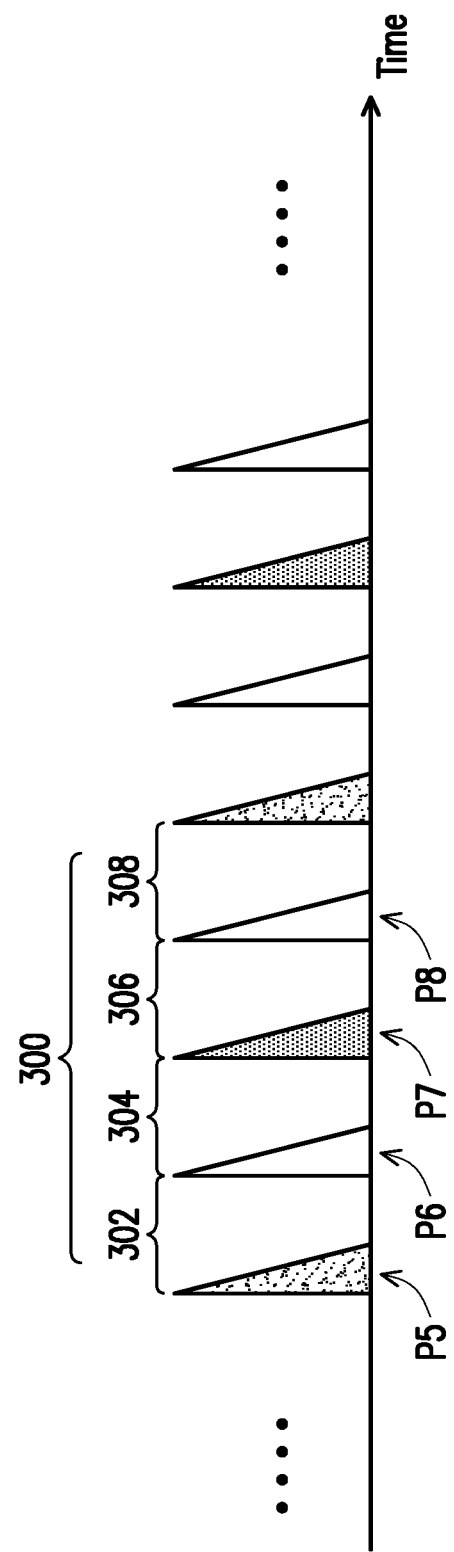
FIG. 3A is a schematic pulse diagram illustrating a method for forming a channel layer in the ferroelectric memory device shown in FIG. 1A, according to some embodiments of the present disclosure.

FIG. 3A is a schematic pulse diagram illustrating a method for forming the channel layer 102, according to some embodiments of the present disclosure.

Referring to FIG. 1A and FIG. 3A, in some embodiments, a method for forming the channel layer 102 includes a single deposition process. In these embodiments, the deposition process may be an atomic layer deposition (ALD) process. During the ALD process, multiple deposition cycles 300 are performed. Each deposition cycle 300 may include a fifth section 302, a sixth section 304, a seventh section 306, and an eighth section 308. A precursor pulse P5 is provided during the fifth section 302, a precursor pulse P6 is provided during the sixth section 304, a precursor pulse P7 is provided during the seventh section 306, and a precursor pulse P8 is provided during the eighth section 308. The precursor used for the precursor pulses P5, P6, P7 may be different from each other. In those embodiments where the channel layer 102 is formed of indium-gallium-zinc-oxide (IGZO), the precursor used for the precursor pulse P5 may be mixed precursor with gallium oxide ($GaO_x$) and indium oxide ($InO_x$), the precursor used for the precursor pulse P6 may be dihydrogen monoxide ($H_2O$), the precursor used for the precursor pulse P7 may be zinc oxide (ZnO), and the precursor used for the precursor pulse P8 may be dihydrogen monoxide ($H_2O$). In some embodiments, the content ratio of gallium oxide ($GaO_x$) to indium oxide ($InO_x$) between 4:6 and 6:4. In some embodiments, each of the precursor pulses P5, P6, P7, P8 is followed by a purge step, such that the precursor pulses P5, P6, P7, P8 may be separated from one another by a non-zero time interval. In addition, the deposition cycle 300 may be repeated until an expected thickness of the channel layer 102 is achieved.

In some alternative embodiments, the precursor used for the precursor pulse P5 may be mixed precursor with a gallium-containing precursor and an indium-containing precursor, the precursor used for the precursor pulse P6 may be an oxygen-containing precursor, the precursor used for the precursor pulse P7 may be a zinc-containing precursor, and the precursor used for the precursor pulse P8 may be an oxygen-containing precursor. For instance, the oxygen-containing precursor may include diatomic oxygen ($O_2$), ozone ($O_3$), dihydrogen monoxide ($H_2O$), plasma $O_3$, plasma $O_2$, or a combination thereof. In addition, as examples, the gallium-containing precursor may include $Ga(C_2H_5)_3$ (trimethylgallium, TEGa), tris(dimethylamido)gallium(III) ($Ga(NMe)_3$), Gallium acetylacetonate ($Ga(C_5H_7O_2)_3$), GaCp (($Cp^*$=η5-C5Me5, dppe=Ph2P(CH 2)2PPh2, M=Cr, W)), Trimethylgallium (TMGa), Tris(dimethylamido)gallium(III) ($Ga_2(NMe_2)_6$), Triethylgallium packaged for use in deposition systems (($CH_3CH_2)_3Ga$), Trimethylgallium packaged for use in deposition systems ($Ga(CH_3)_3$), Tris(dimethylamido)gallium(III) 98% ($C_{12}H_{36}Ga_2N_6$), or a combination thereof. Further, as examples, the indium-containing precursor may include trimethyl-indium (TMIn), triethyl-indium (TEIn), InCp($C_5H_5$In), InCA-1($C_8H_{24}$InNSi$_2$), DADI ($C_7H_{18}$InN), Indium(III) acetate 99.99% trace metals basis ($C_6H_9InO_6$), Indium(III) acetate hydrate 99.99% trace metals basis ($C_6H_9InO_6 \cdot xH_2O$), Indium(III) acetylacetonate≥99.99% trace metals basis ($C_{15}H_{21}InO_6$), or a combination thereof. Moreover, as examples, the zinc-containing precursor may include Zn($CH_3COO$)$_2$ (DEZ), Zn($CH_3$)$_2$ (DMZ), ZnAc (Zinc acetate), ($CH_3$)Zn($OCH(CH_3)_2$), Bis (pentafluorophenyl)zinc 97% (($C_6F_5$)$_2$Zn), Bis(2,2,6,6-tetramethyl-3,5-heptanedionato)zinc(II) 97% (Zn($OCC(CH_3)_3CHCOC(CH_3)_3$)$_2$), Diethylzinc≥52 wt. % Zn basis (($C_2H_5$)$_2$Zn), Diphenylzinc 92% (($C_6H_5$)$_2$Zn), Zinc shot, 99.9999% (Zn), or a combination thereof.

Figure 7A:
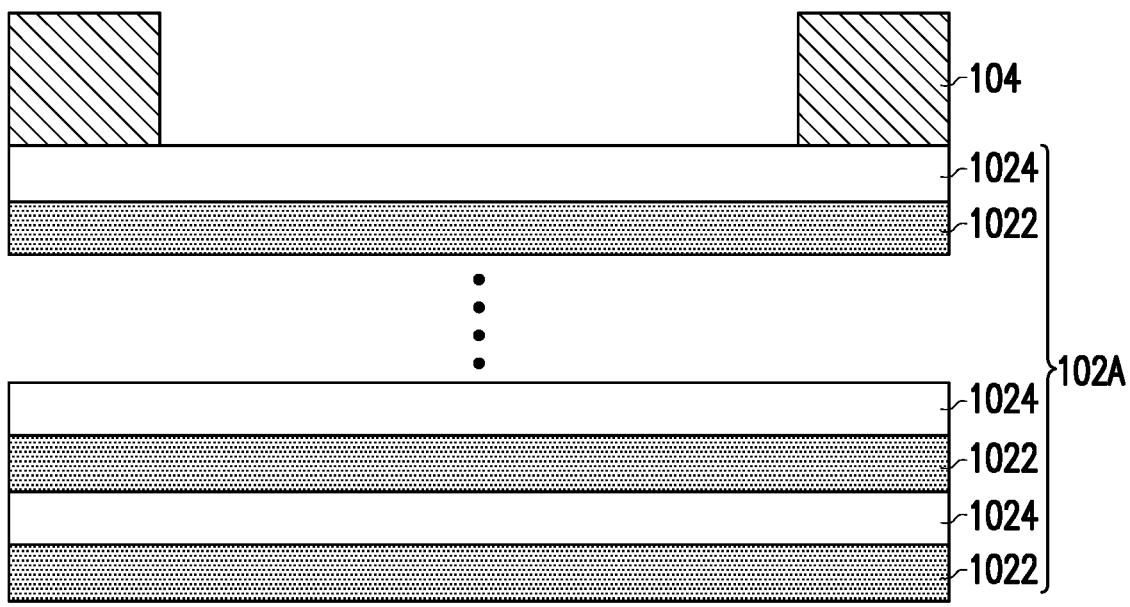
FIG. 7A is a schematic cross-sectional view illustrating a channel layer, according to some embodiments of the present disclosure.

It should be noted that the said ALD process using the mixed and/or cocktail precursor having the gallium-containing precursor and the indium-containing precursor can directly form the channel layer. In detail, as shown in FIG. 7A, the channel layer 102 formed by the said ALD process may include a stack structure having a plurality of first layers 1022 and a plurality of second layers 1024 stacked alternately. Specifically, during each deposition cycle 300, the precursor pulse P5 (e.g., mixing GaO$_x$/InO$_x$) is provided to the ALD process chamber to react, and then the first layer 1022 (e.g., mixing GaO$_x$/InO$_x$ layer) is formed. Next, the precursor pulse P7 (e.g., ZnO) is provided to the ALD process chamber to react, and then the second layer 1024 (e.g., ZnO layer) is formed. In this case, the gallium (Ga) atoms and the indium (In) atoms can be deposited in the same plane, thereby forming the mixing GaO$_x$/InO$_x$ structure with the overlying oxygen layer. That is, by the said ALD process to form the channel layer 102 with the mixing GaO$_x$/InO$_x$ structure directly contacting the underlying gate structure, it can acquire the suitable electron mobility and low surface states ($D_{it}$) for a-IGZO TFT or a-IGZO FeRAM applications.

Figure 7B:
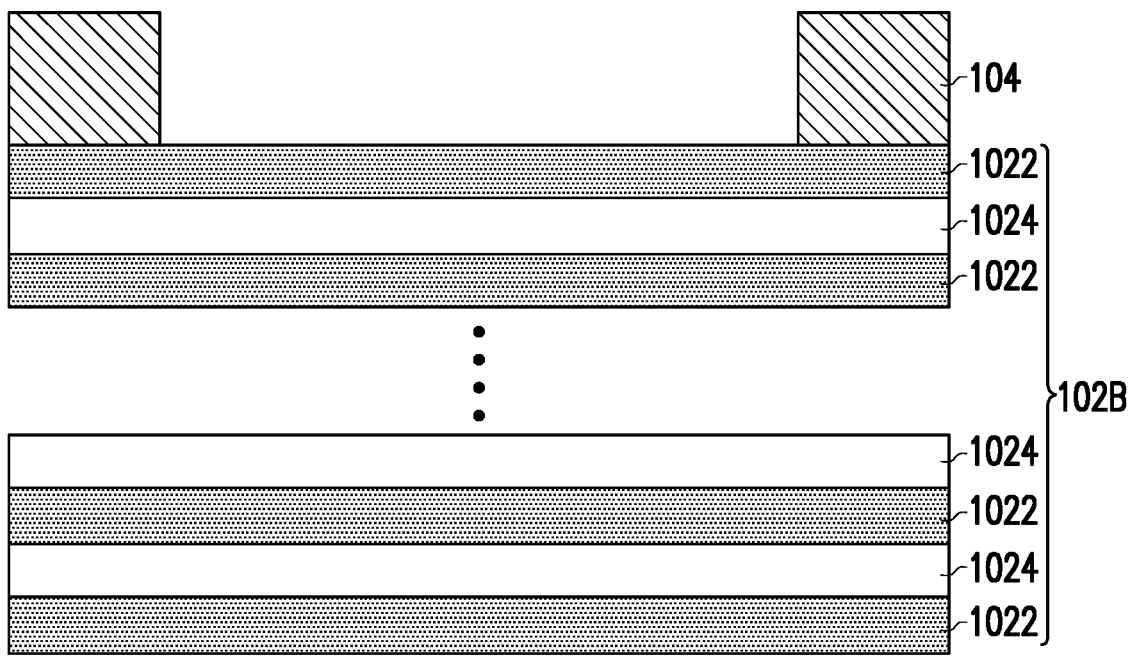
FIG. 7B is a schematic cross-sectional view illustrating a channel layer, according to some alternative embodiments of the present disclosure.

Further, FIG. 7B illustrates a channel layer 102B similar to the channel layer 102A described with reference to FIG. 7A, except that the channel layer 102B has the first layer 1022 directly contacting the overlying source/drain electrodes 104. The like or the same parts in the structure may not be repeated again.

Figure 3B:
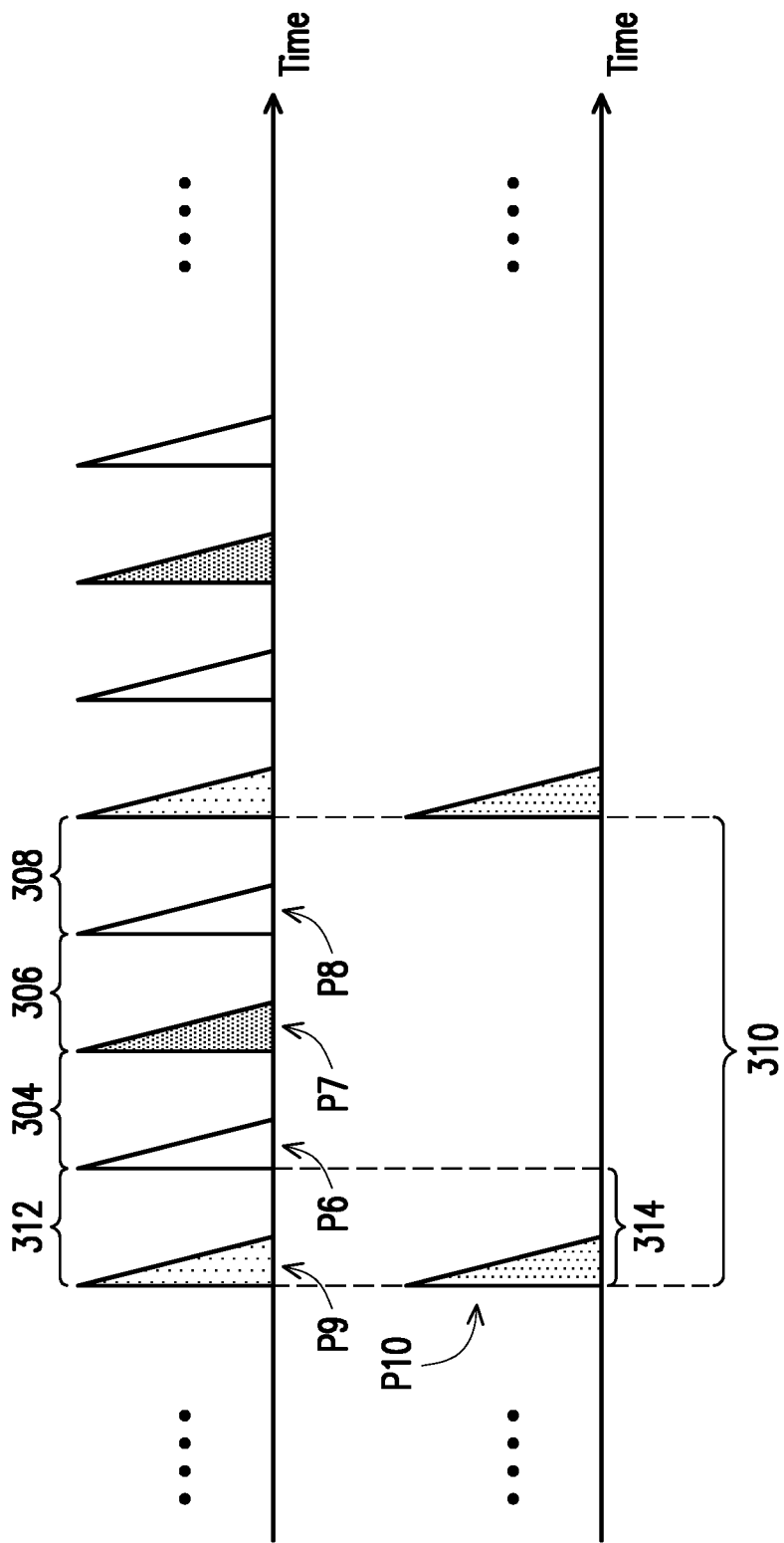
FIG. 3B is a schematic pulse diagram illustrating a method for forming a channel layer in the ferroelectric memory device shown in FIG. 1A, according to some alternative embodiments of the present disclosure.

FIG. 3B is a schematic pulse diagram illustrating a method for forming the channel layer 102, according to some alternative embodiments of the present disclosure. An ALD process to be described with reference to FIG. 3B is similar to the ALD process described with reference to FIG. 3A, thus only difference between these ALD processes will be discussed. The like or the same parts in these ALD processes may not be repeated again.

Referring to FIG. 3B, in the ALD process, multiple deposition cycles 310 are consecutively performed. The deposition cycle 310 is similar to the deposition cycle 300 as described with reference to FIG. 3A, except that a ninth section 312 is overlapped with a tenth section 314 in the same deposition cycle 310, which is followed by the sixth section 304 in this deposition cycle 310. Specifically, during each deposition cycle 310, before the precursor pulse P6 is provided to an ALD process chamber, the precursor pulses P9 and P10 are simultaneously provided to the ALD process chamber. That is, time periods at which the precursor pulses P9, P10 are provided to the ALD process chamber overlap, and the precursor pulse P6 is provided after the precursor pulses P9, P10. In some embodiments, the precursor pulses P9, P10 in the same deposition cycle 310 are entirely overlapped with each other. In those embodiments where the channel layer 102 is formed of indium-gallium-zinc-oxide (IGZO), the precursor used for the precursor pulse P9 may be gallium oxide (GaO$_x$), the precursor used for the precursor pulse P10 may be indium oxide (InO$_x$), the precursor used for the precursor pulse P6 may be dihydrogen monoxide ($H_2O$), the precursor used for the precursor pulse P7 may be zinc oxide (ZnO), and the precursor used for the precursor pulse P8 may be dihydrogen monoxide ($H_2O$). In some alternative embodiments, the precursor used for the precursor pulse P9 may be indium oxide (InO$_x$) and the precursor used for the precursor pulse P10 may be gallium oxide (GaO$_x$). In some embodiments, the precursor used for the precursor pulse P9 may be the gallium-containing precursor or the indium-containing precursor, the precursor used for the precursor pulse P10 may be the indium-containing precursor or the gallium-containing precursor, and the precursor used for the precursor pulse P10 may be different from the precursor used for the precursor pulse P9. The precursor used for the precursor pulse P6 may be an oxygen-containing precursor, the precursor used for the precursor pulse P7 may be a zinc-containing precursor, and the precursor used for the precursor pulse P8 may be an oxygen-containing precursor.

It should be noted that the said ALD process by simultaneously providing the gallium-containing precursor and the indium-containing precursor during the overlapping section can directly form the channel layer 102 with the mixing GaO$_x$/InO$_x$ structure. Specifically, the gallium-containing precursor and the indium-containing precursor can be mixed uniformly during the overlapping section 312/314 to form the first layer 1022 (e.g., mixing GaO$_x$/InO$_x$ structure) illustrated in FIG. 7A and FIG. 7B. In this embodiment, the gallium-containing precursor and the indium-containing precursor may be referred to as co-pulsing precursors. In addition, the structure of the channel layer formed by the said ALD process by using the co-pulsing precursors is also illustrated in FIG. 7A and FIG. 7B, which has been described in detail in the above paragraphs, and will not be repeated here.

Figure 3C:
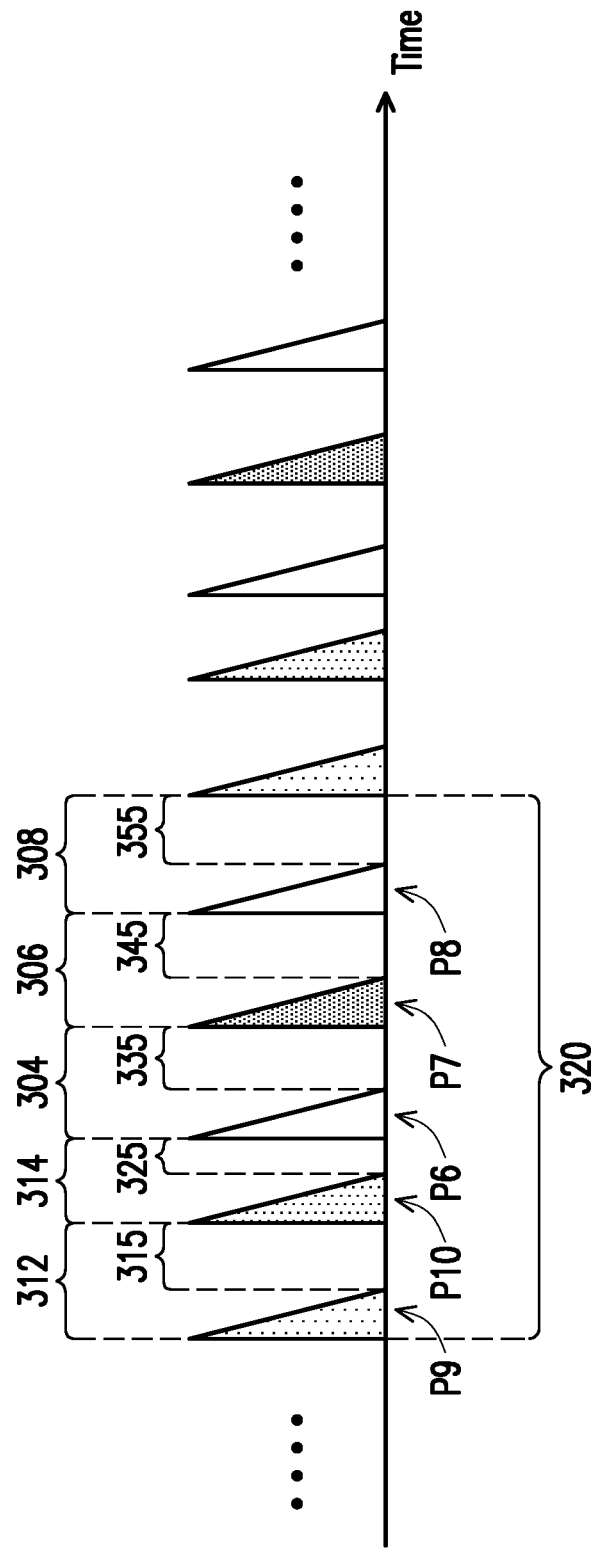
FIG. 3C is a schematic pulse diagram illustrating a method for forming a channel layer in the ferroelectric memory device shown in FIG. 1A, according to some other embodiments of the present disclosure.

FIG. 3C is a schematic pulse diagram illustrating a method for forming the channel layer 102, according to some other embodiments of the present disclosure. An ALD process to be described with reference to FIG. 3C is similar to the ALD process described with reference to FIG. 2A, thus only difference between these ALD processes will be discussed. The like or the same parts in these ALD processes may not be repeated again.

Referring to FIG. 3C, in the ALD process, multiple deposition cycles 320 are consecutively performed. The deposition cycle 320 is similar to the deposition cycle 300 as described with reference to FIG. 3A, except that a tenth section 314 has a short purge 325, which is followed by the sixth section 304 in this deposition cycle 320. Specifically, during each deposition cycle 320, the precursor pulse P9 is provided to an ALD process chamber to react, and then a normal purge 315 is performed to remove the unreacted precursor used for the precursor pulse P9 during the ninth section 312. Next, the precursor pulse P10 is provided to the ALD process chamber to react, and then the short purge 325 is performed to remove the unreacted precursor used for the precursor pulse P10 during the tenth section 314. Afterward, the precursor pulse P6 is provided to the ALD process chamber to react, and then a normal purge 335 is performed to remove the unreacted precursor used for the precursor pulse P6 during the sixth section 304. Thereafter, the precursor pulse P7 is provided to the ALD process chamber to react, and then a normal purge 345 is performed to remove the unreacted precursor used for the precursor pulse P7 during the seventh section 306. Next, the precursor pulse P8 is provided to the ALD process chamber to react, and then a normal purge 355 is performed to remove the unreacted precursor used for the precursor pulse P8 during the eighth section 308. It should be noted that the precursors used for the precursor pulses P9 and P10 can be mixed uniformly and seldom be purged during the short purge 325. In this case, when the channel layer 102 is formed of indium-gallium-zinc-oxide (IGZO), the gallium (Ga) atoms and the indium (In) can be deposited in the same plane, thereby forming the mixing $GaO_x/InO_x$ structure with the overlying oxygen layer. That is, by the said ALD process to form the channel layer 102 with the mixing $GaO_x/InO_x$ structure directly contacting the underlying gate structure, it can acquire the suitable electron mobility and low surface states ($D_{it}$) for a-IGZO TFT or a-IGZO FeRAM applications. In some embodiments, the time of the short purge 325 is less than 1 second. In some alternative embodiments, the time of the short purge 325 is less than 0.1 second. In some embodiments, a ratio of the time of the normal purge 315, 335, 345, or 355 to the time of the short purge 325 is about 5:1. In addition, the structure of the channel layer formed by the said ALD process by using the short purge is also illustrated in in FIG. 7A and FIG. 7B, which has been described in detail in the above paragraphs, and will not be repeated here.

Figure 7C:
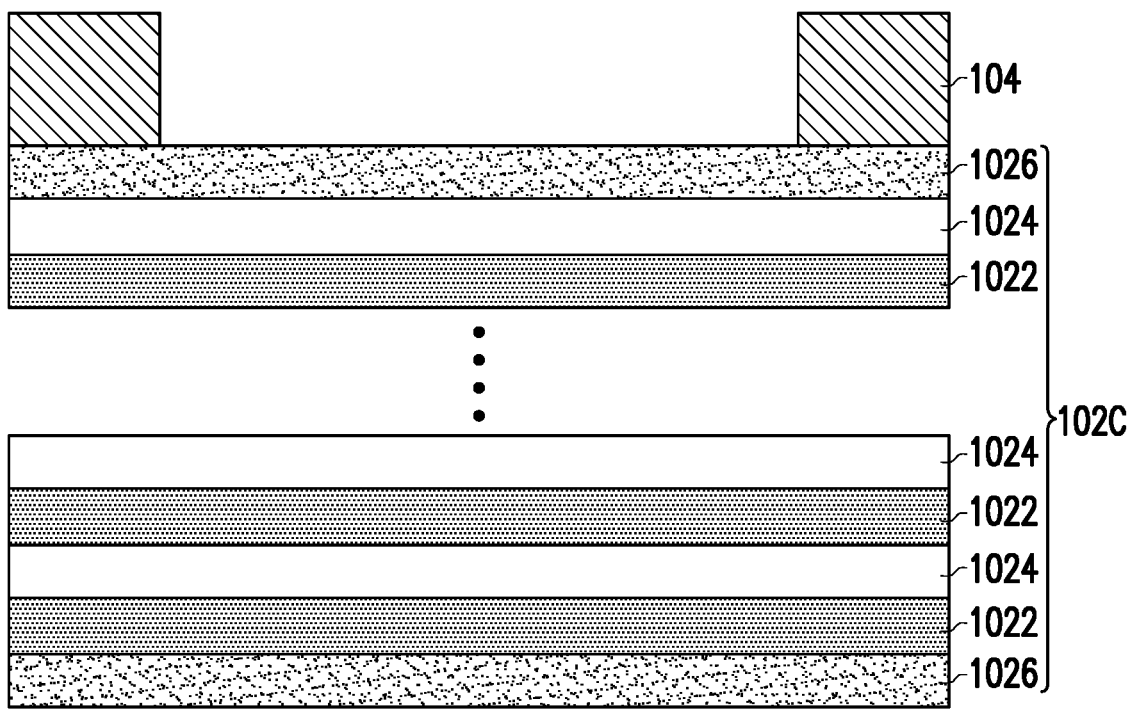
FIG. 7C is a schematic cross-sectional view illustrating a channel layer, according to some other embodiments of the present disclosure.

Further, FIG. 7C illustrates a channel layer 102C similar to the channel layer 102A described with reference to FIG. 7A, except that the channel layer 102C has two third layers 1026 respectively disposed below and above the stack structure formed of the first layers 1022 and the second layers 1024. That is, the stack structure formed of the first layers 1022 and the second layers 1024 are sandwiched between the third layers 1026. In some embodiments, the third layers 1026 is a mixing layer of InO/GaO/ZnO/SiO, thereby forming a double-heterojunction design. The third layers 1026 may be in direct contact with the overlying source/drain electrodes 104 and/or the underlying ferroelectric layer 106 or blocking layer 114 (FIG. 1A). In some alternative embodiments, the SiO of the third layer 1026 may be replaced by Hf, Zr or any stronger bond energy than In—O and Zn—O.

Figure 4:
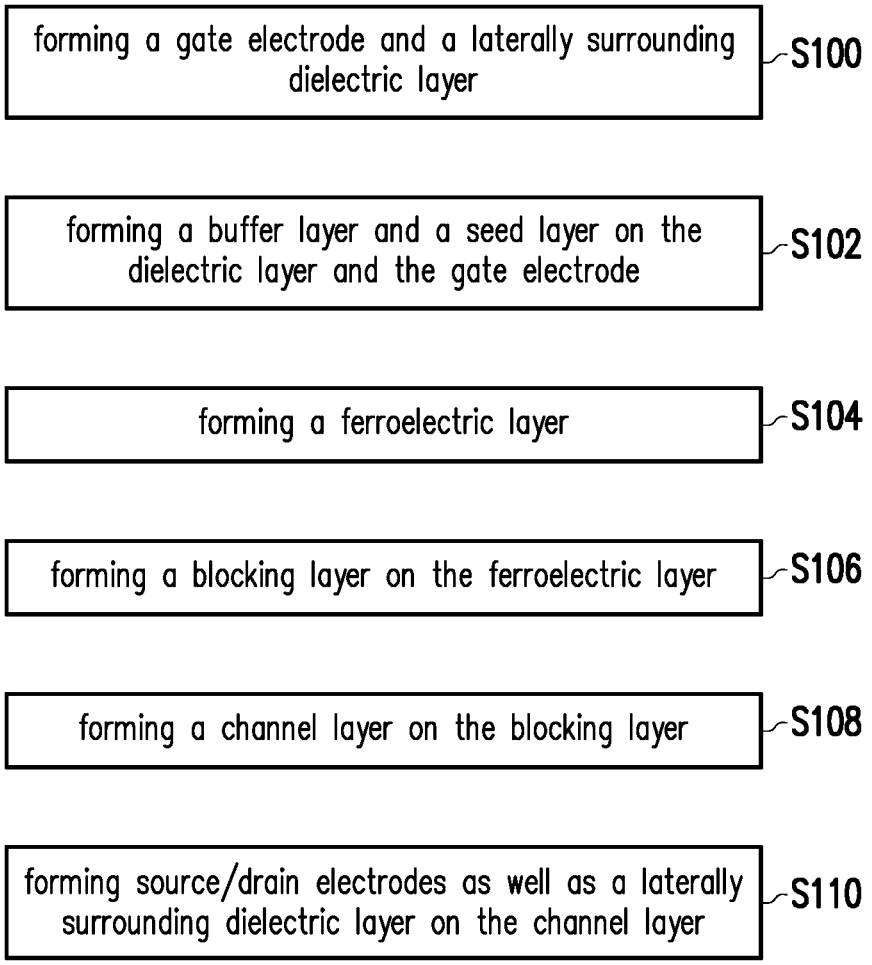
FIG. 4 is a flow diagram illustrating a method for forming the ferroelectric memory device as shown in FIG. 1A, according to some embodiments of the present disclosure.

FIG. 4 is a flow diagram illustrating a method for forming the ferroelectric memory device 10 as shown in FIG. 1A, according to some embodiments of the present disclosure. FIG. 5A through FIG. 5D are cross-sectional views illustrating intermediate structures during the manufacturing process as shown in FIG. 4.

Figure 5A:
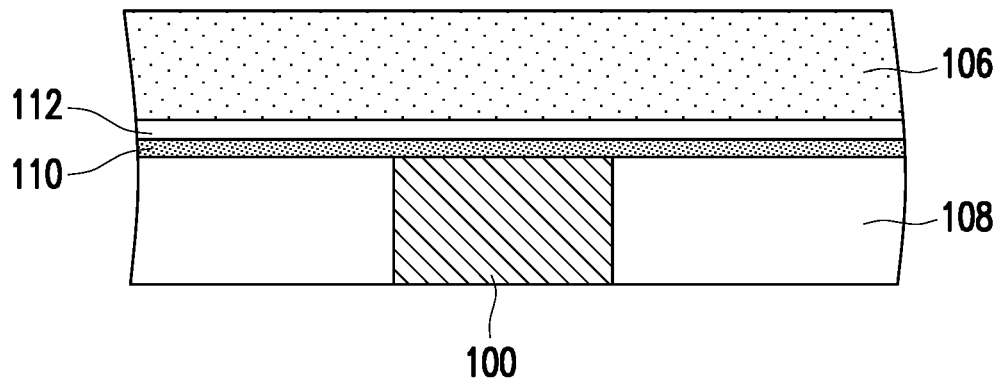
FIG. 5A through FIG. 5D are cross-sectional views illustrating intermediate structures during the manufacturing process as shown in FIG. 4.

Referring to FIG. 4 and FIG. 5A, a step S100 is performed, and the gate electrode 100 and the laterally surrounding dielectric layer 108 are formed. As described with reference to FIG. 1A, the dielectric layer 108 may be one of a stack of dielectric layers in a BEOL structure formed over a FEOL structure including active devices disposed on a semiconductor substrate. In addition, the gate electrode 100 may be a portion of a metallization layer formed in the stack of dielectric layers of the BEOL structure. In some embodiments, a damascene process may be used for forming the dielectric layer 108 and the gate electrode 100. The damascene process described in the present disclosure may include depositing a dielectric layer, forming at least one trench/hole in the dielectric layer, filling a conductive material in the trench/hole, and performing a planarization process to remove portions of the conductive material over the dielectric layer. For instance, the planarization process may include a polishing process, an etching process or a combination thereof.

In some embodiments, a step S102 is then performed, to form the buffer layer 110 and the seed layer 112 on the dielectric layer 108 and the gate electrode 100. The buffer layer 110 and the seed layer 112 may be respectively formed by a deposition process. In some embodiments, the buffer layer 110 and the seed layer 112 are respectively formed by an ALD process. In alternative embodiments, the buffer layer 110 and the seed layer 112 are respectively formed by a CVD process, a physical vapor deposition (PVD) process or a PLD process.

Subsequently, a step S104 is performed, and the ferroelectric layer 106 is formed. In those embodiments where the buffer layer 110 and the seed layer 112 are pre-formed on the dielectric layer 108 and the gate electrode 100, the ferroelectric layer 106 is formed on the seed layer 112. In alternative embodiments where the buffer layer 110 and the seed layer 112 are omitted, the ferroelectric layer 106 may be formed on the dielectric layer 108 and the gate electrode 100. A method for forming the ferroelectric layer 106 may include a deposition process. In some embodiments, the deposition process is an ALD process. The steps of forming the ferroelectric layer 106 by using the ALD process have been described in detail in the above paragraphs of FIG. 2A to FIG. 2D, and will not be repeated here.

Figure 5B:
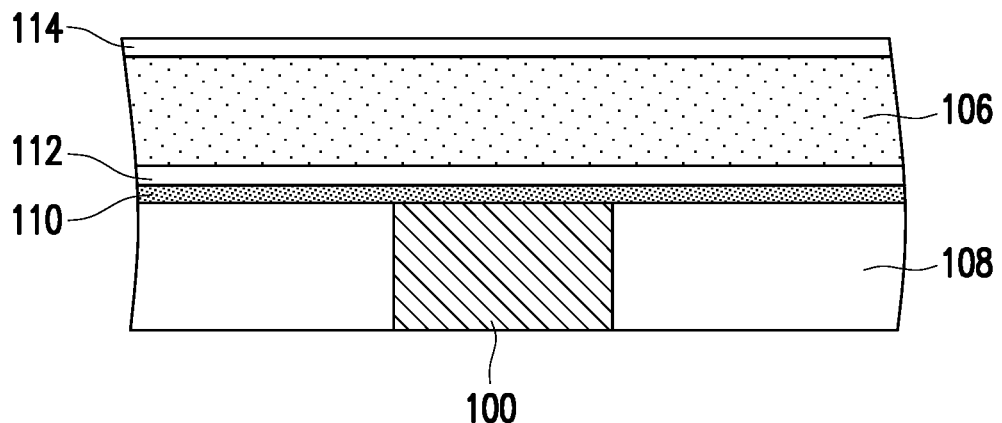

Referring to FIG. 4 and FIG. 5B, a step S106 is performed, and the blocking layer 114 is formed on the ferroelectric layer 106. In some embodiments, the blocking layer 114 may be formed by an ALD process. In alternative embodiments, the blocking layer 114 may be formed by a CVD process, a PVD process or a PLD process.

Figure 5C:
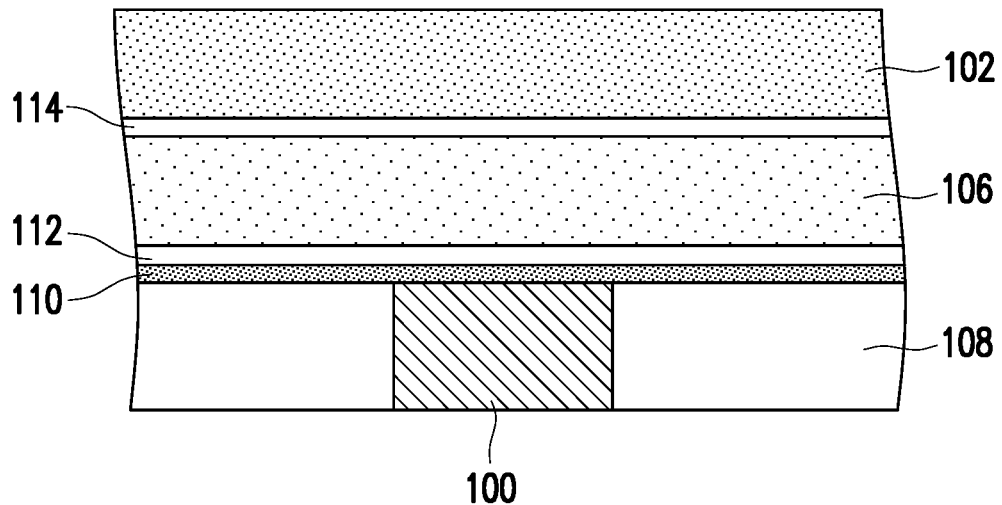

Referring to FIG. 4 and FIG. 5C, a step S108 is performed, and the channel layer 102 is formed on the blocking layer 114. In some embodiments where the channel layer 102 is formed of an oxide semiconductor material, a method for forming the channel layer 102 includes a deposition process. As an example, the deposition process may be an ALD process. The steps of forming the channel layer 102 by using the ALD process have been described in detail in the above paragraphs of FIG. 3A to FIG. 3C, and will not be repeated here.

Figure 5D:
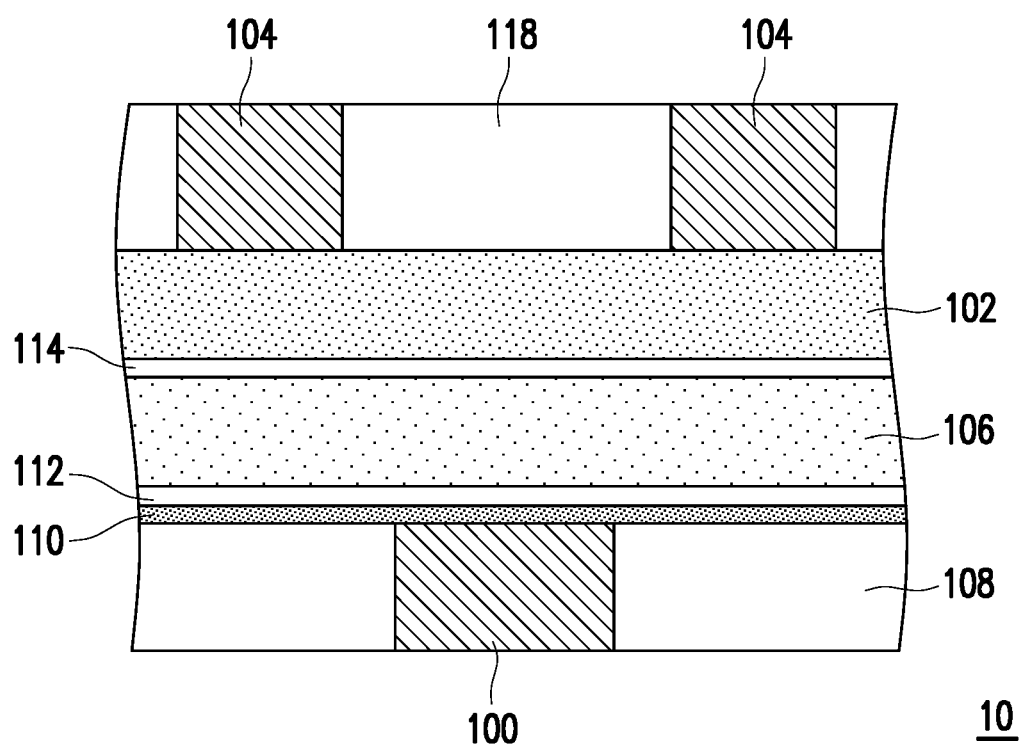

Referring to FIG. 4 and FIG. 5D, a step S110 is performed, and the source/drain electrodes 104 as well as the laterally surrounding dielectric layer 118 are formed on the channel layer 102. In some embodiments, a damascene process may be used for forming the dielectric layer 118 and the source/drain electrodes 104.

Up to here, the ferroelectric memory device 10 as shown in FIG. 5D has been formed. Subsequently, further BEOL process may be performed to out rout the gate electrode 100 as well as the source/drain electrodes 104, and to complete formation of the BEOL structure.

Figure 8A:
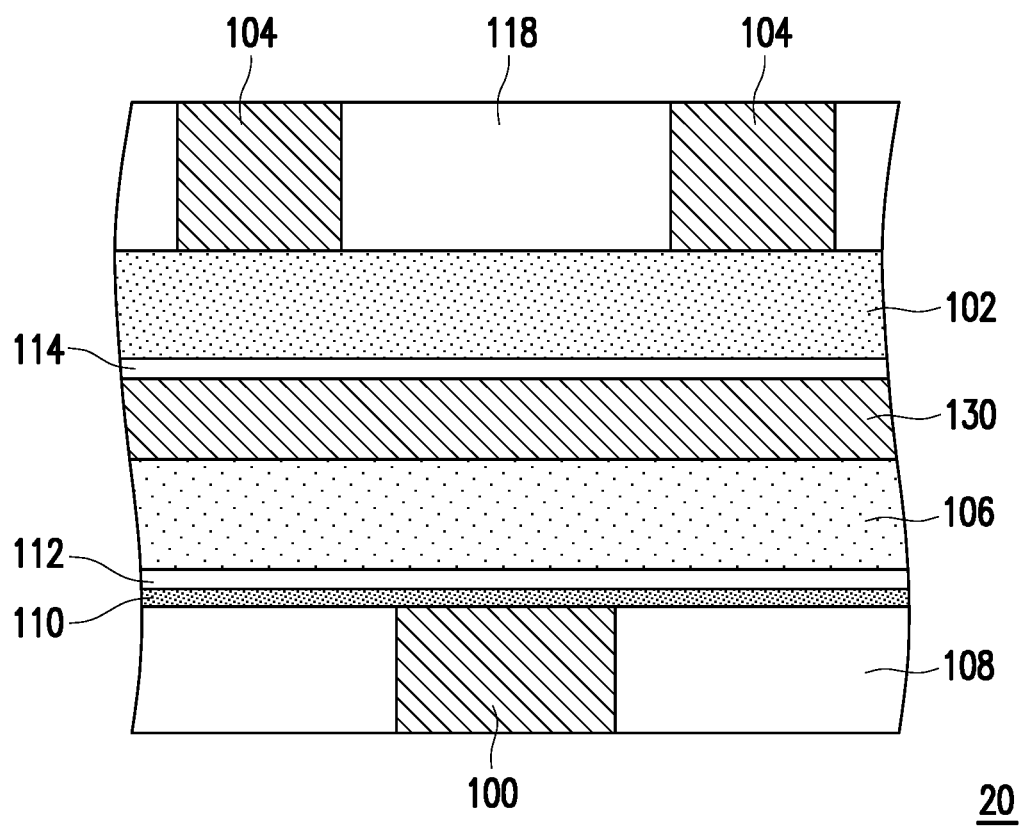
FIG. 8A is a schematic cross-sectional view illustrating a ferroelectric memory device, according to some embodiments of the present disclosure.
Figure 8B:
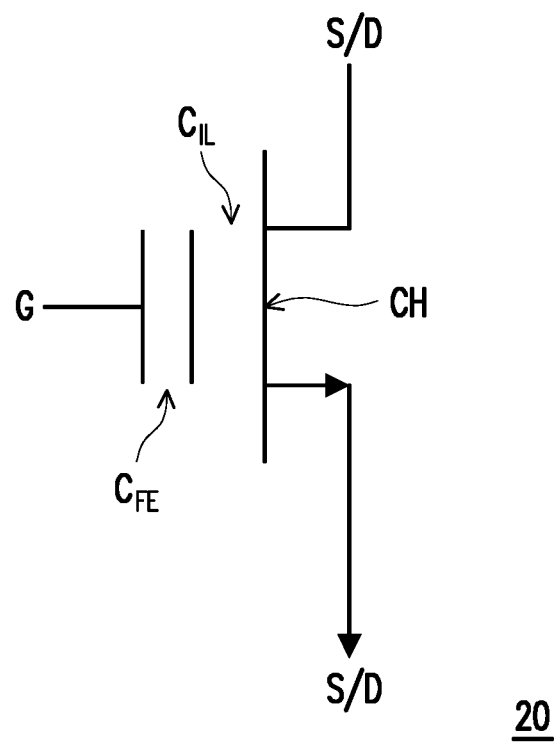
FIG. 8B is a circuit diagram of the ferroelectric memory device as shown in FIG. 8A.

FIG. 8A is a schematic cross-sectional view illustrating a ferroelectric memory device 20, according to some embodiments of the present disclosure. FIG. 8B is a circuit diagram of the ferroelectric memory device 20 as shown in FIG. 8A. The ferroelectric memory device 20 is similar to the ferroelectric memory device 10 as described with reference to FIG. 1A. Only the differences between the ferroelectric memory devices 10, 20 will be described. The same or the like parts of the ferroelectric memory devices 10, 20 would not be repeated again.

Referring to FIG. 8A, the ferroelectric memory device 20 may be a metal-ferroelectric-metal-insulator-semiconductor (MFMIS) FET, and includes a floating gate layer 130 inserted between the channel layer 102 and the ferroelectric layer 106. In some embodiments, the blocking layer 114 is sandwiched between the channel layer 102 and the floating gate layer 130. In these embodiments, a gate capacitor between the floating gate layer 130 and the channel layer 102 is formed across the blocking layer 114, and may be referred as a metal-insulator-semiconductor (MIS) capacitor. On the other hand, a gate capacitor between the floating gate layer 130 and the gate electrode 100 is formed across layers including the ferroelectric layer 106, and may be referred as a metal-ferroelectric-metal (MFM) capacitor or a ferroelectric capacitor. The MIS capacitor is connected with the MFM capacitor the shared floating gate layer 130, thus the MIS capacitor and the MFM capacitor are serially connected. In some embodiments, the floating gate layer 130 is electrically floated. The floating gate layer 130 may be formed of one or a combination of more than one of the candidates of the conductive material for forming the gate electrode 100, as described with reference to FIG. 1A. In some embodiments, a thickness of the floating gate layer 130 ranges from 1 nm to 1000 nm. By inserting the floating gate layer 130 between the ferroelectric layer 106 and the channel layer 102, intermixing of the ferroelectric layer 106 and the channel layer 102 may be further prevented, and the interface defined between the ferroelectric layer 106 and the channel layer 102 may be improved. Further, the floating gate layer 130 can effectively apply electric field on the ferroelectric layer 106 and improve the polarization value.

Referring to FIG. 8A and FIG. 8B, the gate electrode 100 may be functioned as a gate terminal G of the MFMIS FET, and the source/drain electrodes 104 may be functioned as source/drain terminals S/D of the MFMIS FET. A conduction channel CH extending between the source/drain terminals S/D may be established in the channel layer 102. The MFM capacitor defined between the gate electrode 100 (i.e., the gate terminal G) and the floating gate layer 130 is indicated by a gate capacitor $C_{FE}$. In addition, the MIS capacitor defined between the floating gate layer 130 and the channel layer 102 (i.e., the conduction channel CH) is indicated by a gate capacitor $C_{IL}$. As shown in FIG. 8B, the gate capacitor $C_{FE}$ and the gate capacitor $C_{IL}$ are in serial connection between the gate terminal G and the conduction channel CH.

A method for forming the ferroelectric memory device 20 is similar to the method for forming the ferroelectric memory device 10, as described with reference to FIG. 4, FIG. 5A through FIG. 5D, except that a step of forming the floating gate layer 130 is further performed after formation of the ferroelectric layer 106 and before formation of the blocking layer 114. In some embodiments, a method for forming the floating gate layer 130 includes a deposition process, a plating process or a combination thereof. In some embodiments where the floating gate layer 130 is formed by the electroplating process, an additional seed layer (not shown) is formed between the ferroelectric layer 106 and the floating gate layer 130.

Figure 9:
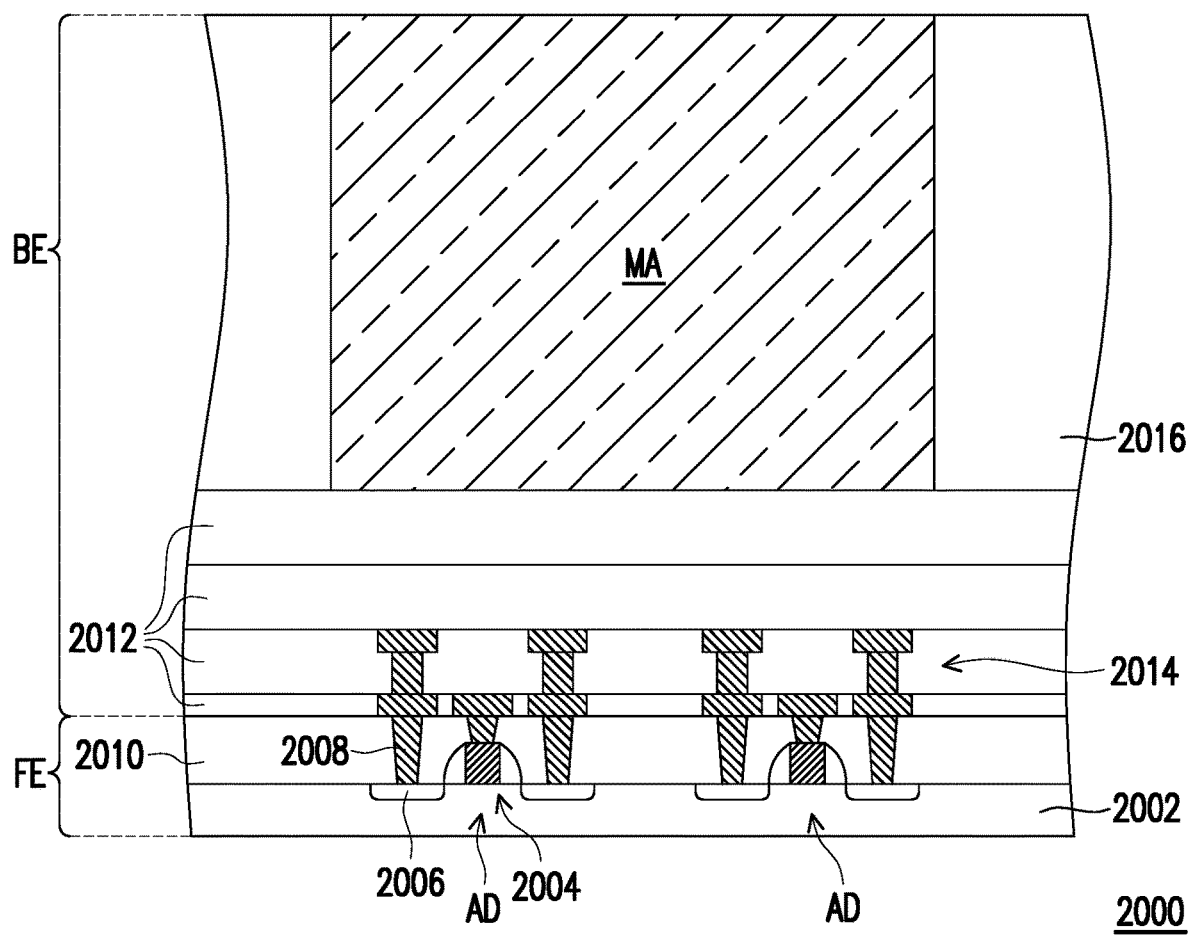
FIG. 9 is a cross-sectional view illustrating a portion of a semiconductor chip, according to some embodiments of the present disclosure.

FIG. 9 is a cross-sectional view illustrating a portion of a semiconductor chip 2000 according to some embodiments of the present disclosure.

Referring to FIG. 9, as described above, a memory array MA including a plurality of ferroelectric memory devices may be embedded in a BEOL structure BE of a semiconductor chip 2000. The memory array MA may be a two-dimensional memory array including a plurality of the ferroelectric memory devices described with reference to FIG. 1A or FIG. 8A and arranged at the same horizontal level. Alternatively, the memory array MA may be a three-dimensional memory array. The BEOL structure BE is formed on a FEOL structure FE, and includes conductive elements electrically connected to active devices in the FEOL structure FE. In some embodiments, the FEOL structure FE is formed on a surface region of a semiconductor substrate 2002. For instance, the semiconductor substrate 2002 may be a semiconductor wafer or a SOI wafer. The FEOL structure FE may include active devices AD. For conciseness, only two of the active devices AD are depicted. The active devices AD, such as metal-oxide-semiconductor (MOS) FETs, may respectively include a gate structure 2004 and source/drain structures 2006 at opposite sides of the gate structure 2004. In some embodiments, the gate structure 2004 is disposed on a substantially flat surface of the semiconductor substrate 2002, and the source/drain structures 2006 at opposite sides of the gate structure 2004 are formed in shallow regions of the semiconductor substrate 2002. In these embodiments, the active device AD may be referred as a planar-type MOSFET, and a conduction channel may be established in a skin portion of the semiconductor substrate 2002 covered by the gate structure 2004 and extending between the source/drain structures 2006. In alternative embodiments, the active device AD is formed as a fin-type FET (or referred as finFET) or a gate-all-around (GAA) FET. In these alternative embodiments, conduction channels of these FETs may be established in three-dimensional active structures intersected with and covered by gate structures. Further, the FEOL structure FE may include contact plugs 2008 standing on the gate structures 2004 and the source/drain structures 2006, as well as a dielectric layer 2010 laterally surrounding the gate structure 2004 and the contact plugs 2008.

The BEOL structure BE may include a stack of dielectric layers 2012, and include conductive elements 2014 formed in the stack of dielectric layers 2012. The conductive elements 2014 are electrically connected to the active devices AD in the FEOL structure FE, and may also be referred as interconnections. The conductive elements 2014 may include conductive traces and conductive vias. The conductive traces respectively extend on one of the dielectric layers 2012, whereas the conductive vias respectively penetrate through one or more of the dielectric layers 2012, and establish electrical contact with one or more of the conductive traces. The memory array MA may be disposed on the stack of the dielectric layers 2012, and terminals of the ferroelectric memory devices in the memory array MA are routed to the underlying conductive elements 2014. Accordingly, the memory array MA can be routed to the active devices AD, and can be driven by these active devices AD. In some embodiments, the memory array MA may be laterally surrounded by at least one dielectric layer 2016. Further, more dielectric layer(s) and conductive elements (both not shown) may be formed on the dielectric layer 2016 and the memory array MA.

In accordance with an embodiment, a method of forming a ferroelectric memory device, including: forming a ferroelectric layer between a gate electrode and a channel layer by a first atomic layer deposition (ALD) process, wherein the first ALD process comprises: providing a first precursor during a first section; and providing a first mixed precursor during a second section, wherein the first mixed precursor comprises two precursors that are different from each other.

In accordance with an embodiment, a method of forming a ferroelectric memory device, including: forming a ferroelectric layer between a gate electrode and a channel layer by a first atomic layer deposition (ALD) process, wherein the first ALD process comprises: providing a first precursor during a first section; and simultaneously providing a second precursor and a third precursor during a second section, wherein a pulse time for providing the second precursor is overlapped with a pulse time for providing the third precursor.

In accordance with an embodiment, a method of forming a ferroelectric memory device, including: forming a ferroelectric layer between a gate electrode a channel layer by an atomic layer deposition (ALD) process, wherein the ALD process comprises: performing a plurality of deposition cycles, each deposition cycle sequentially comprising a first section, a second section, and a third section, wherein a purge time in the third section is less than a purge time in one of the first and second sections.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a ferroelectric memory device, comprising:
   forming a ferroelectric layer between a gate electrode and a channel layer by a first atomic layer deposition (ALD) process, wherein the first ALD process comprises:
   providing a first precursor during a first section; and
   providing a first mixed precursor during a second section, wherein the first precursor comprises an oxygen-containing precursor, the first mixed precursor comprises a hafnium-containing precursor and a zirconium-containing precursor, and a content ratio of hafnium-containing precursor to zirconium-containing precursor between 4:6 and 6:4, thereby forming the ferroelectric layer having a plurality of oxygen layers and a plurality of mixing Hf/Zr layers stacked alternately.

2. The method according to claim 1, wherein the channel layer is formed by a second ALD process, and the second ALD process comprises:
   providing a second mixed precursor during a third section, wherein the second mixed precursor comprises two precursors that are different from each other;
   providing a fourth precursor during a fourth section;
   providing a fifth precursor during a fifth section; and
   providing a sixth precursor during a sixth section.

3. The method according to claim 2, wherein the second mixed precursor comprises $GaO_x$ and $InO_x$, the fourth precursor comprises $H_2O$, the fifth precursor comprises ZnO, and the sixth precursor comprises $H_2O$.

4. The method according to claim 1, wherein the channel layer is formed by a second ALD process, and the second ALD process comprises:
   simultaneously providing a second precursor and a third precursor during a third section, wherein the second precursor and the third precursor are different from each other;
   providing a fourth precursor during a fourth section;
   providing a fifth precursor during a fifth section; and
   providing a sixth precursor during a sixth section.

5. The method according to claim 4, wherein the second precursor comprises $GaO_x$, the third precursor comprises $InO_x$, the fourth precursor comprises $H_2O$, the fifth precursor comprises ZnO, and the sixth precursor comprises $H_2O$.

6. The method according to claim 1, wherein the channel layer is formed by a second ALD process, and the second ALD process comprises: performing a plurality of deposition cycles, each deposition cycle sequentially comprising a third section, a fourth section, a fifth section, a sixth section, and a seventh section,
   wherein a purge time in the fourth section is less than a purge time in one of the third, fifth, sixth, and seventh sections.

7. The method according to claim 6, wherein
   the third section provides a third precursor comprising $GaO_x$,
   the fourth section provides a fourth precursor comprising $InO_x$,
   the fifth section provides a fifth precursor comprising $H_2O$,
   the sixth section provides a sixth precursor including ZnO, and
   the seventh section provides a seventh precursor including $H_2O$.

8. The method according to claim 6, wherein a ratio of the purge time of the one of the third, fifth, sixth, and seventh sections to the purge time of the fourth section is 5:1.

9. The method according to claim 1, wherein the ferroelectric layer is $Hf_xZr_yO_z$, and x:y:z is 1:1:4.

* * * * *